United States Patent [19]

McCutchan et al.

[11] 4,297,633

[45] Oct. 27, 1981

[54] ELECTRIC FENCE MONITORING SYSTEM WITH ENERGIZER, RESPONDER AND RECEIVER

[75] Inventors: John C. McCutchan, Lower Plenty; Rex C. Niven, East Melbourne, both of Australia

[73] Assignee: The University of Melbourne, Parkville, Australia

[21] Appl. No.: 56,004

[22] Filed: Jul. 9, 1979

Related U.S. Application Data

[63] Continuation of Ser. No. 923,348, Jul. 10, 1978, abandoned, which is a continuation of Ser. No. 753,903, Dec. 23, 1976, abandoned.

[30] Foreign Application Priority Data

Dec. 23, 1975 [AU] Australia .............................. PC4375

[51] Int. Cl.$^3$ ....................... G01R 31/02; G08B 26/00

[52] U.S. Cl. ........................................ 324/51; 324/52; 340/505; 340/651

[58] Field of Search ............................ 324/51, 52, 54; 340/152 T, 167 B, 167 R, 310 R, 505, 552, 564, 567, 650, 647, 651, 652, 659; 343/5 PD, 6.5 R; 179/175.3 R, 175.3 F, 175.31 R

[56] References Cited

U.S. PATENT DOCUMENTS

| | | | |
|---|---|---|---|
| 2,440,900 | 5/1948 | Heimke | 340/650 |
| 2,971,184 | 2/1961 | Pearson et al. | 340/564 |
| 3,031,643 | 4/1962 | Sheftelman | 324/52 X |
| 3,496,559 | 2/1970 | Brumfield et al. | 340/650 |
| 3,668,640 | 6/1972 | Driscoll | 340/167 B |
| 3,815,093 | 6/1974 | Caretto et al. | 340/152 T |
| 3,838,419 | 9/1974 | McSorley et al. | 340/505 |
| 3,952,294 | 4/1976 | Emerson et al. | 340/310 R X |

*Primary Examiner*—Gerard R. Strecker
*Attorney, Agent, or Firm*—Murray and Whisenhunt

[57] ABSTRACT

Electric fences have been used for many years to control the movement of animals but where these fences have spanned large distances it has been very difficult to ensure that the fence is effective at the perimeters of the distance without continual supervision of the fence. The invention relates to a monitor which has one or more responders, preferably located at remote points of the fence which can transmit a return signal to a receiver at a convenient point to indicate the effectiveness of the fence.

9 Claims, 3 Drawing Figures

ELECTRIC FENCE MONITORING SYSTEM WITH ENERGIZER, RESPONDER AND RECEIVER

This is a continuation application of Ser. No. 923,348, filed July 10, 1978, now abandoned, which is a Rule 60 continuation application of Ser. No. 753,903, filed Dec. 23, 1976, now abandoned.

This invention relates to improvements in monitoring systems for electric fences and is particularly useful to monitor electric fences which are of substantial length.

In many countries, and particularly in Australia and New Zealand, interest in electric fencing is reviving and it is possible using modern fence energizers or controllers to provide an effective way of retaining animals in defined areas which is more economical than the use of standard fences. The animals are deterred from forcing through the fence by receiving an electric shock rather than by mechanical restraint. Also, it is possible by using electrified fences to provide relatively easily moveable fencing which will nevertheless effectively restrain animals.

Notwithstanding these advantages, electric fences have been considered to have certain disadvantages. The first is that the strength of the electrical pulses travelling along the fence can change, for example, if grass growth comes into contact with the fence wires there can be a current leakage to earth, and if the insulation deteriorates there can also be excessive leakage. Each of these conditions causes a reduction in the magnitude of the electrical voltage pulse at points on the fence remote from the energizer, so reducing the effectiveness of the electric fence.

On other occasions, fence wires can be broken which causes a complete electrical failure of fence sections separated by the breach from the energizer, or there can be a complete short circuit of the fence which, again, prevents any pulses passing beyond the short circuit.

As previously mentioned the effectiveness of the fence relies on the pulse to cause an electric shock to animals and if there is any deterioration or loss of the pulse, the animals will become aware of this and may then pass through the fence.

In order to overcome these disadvantages it has been necessary to patrol the fence to look for physical changes or to take measurements at remote points on the fence to ensure that the fence is operating effectively.

Checking the fence at remote points is time consuming if the fence system is an extensive one. If it is not to be checked, it is conventional to build the fence with sufficiently strong wires to deter animals from breaking through even though there are no pulses passing along the fence. This reduces the economies of using electric fences.

The object of the invention is to provide an electric fence monitor which permits the condition of the fence at a remote point to be readily checked from a position convenient to the owner, and which automatically operates an alarm if the effectiveness of the fence falls below a pre-set level.

The invention includes an electric fence monitor comprising a responder adapted to be located at any chosen point on the fence which responder is activated by fence pulses and under predetermined conditions it transmits a return signal to a receiver which interprets the signal to provide an indication of the fence effectiveness. In the simplest conditions the responder transmits a return signal after each pulse but alternatively the return signal may only be transmitted after a particular parameter is met.

Preferably there may be a plurality of responders each associated with the receiver and each responder may be at a different remote point of the fence.

Preferably, the responder is activated by the fence pulses and the number of such pulses received before the return pulse occurs provides an indication of the fence effectiveness.

In order that the invention may be more readily understood, we shall describe one form of monitor system made in accordance with the invention, together with certain modifications thereof.

The form of monitor system to be described is illustrated in the accompanying drawings, in which.

Figure 1:
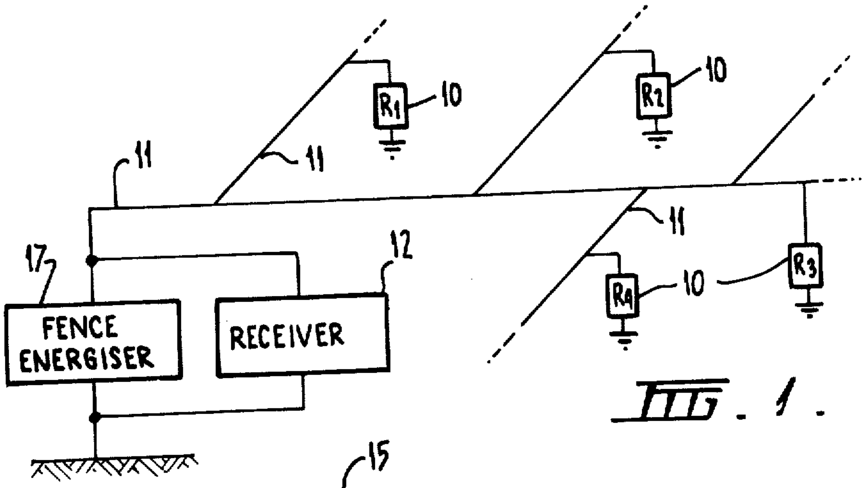
FIG. 1 is a schematic view of an electric fence having a number of branches.

The system comprises a number of similar responders 10 which are each connected to a selected point on the fence, usually remote from the energizer. The number of responders selected depends on the extent of the fence system and the number of remote branches of the fence 11.

It also includes a receiver 12 which is adapted to interpret the outputs of the responders 10. Each responder 10 is adapted to read some parameter of the fence pulses, normally the peak voltage of the pulse as received at the responder but could also be designed to read the period, the shape or a combination of these and/or other quantities. Each pulse causes a change in state in Block A 13 of FIG. 2 which uses well known electronic techniques to accumulate readings of the parameter being measured by the responder and after a number of pulses, which is determined by the required accumulated magnitude of the parameter being measured, Block A 13 is adapted to provide a trigger pulse. After the trigger pulse is formed, it passes to a delay circuit 22 in which it is delayed by a predetermined time which is less than the interval between fence energizer 17 pulses and after this delay the trigger signal initiates the operation of the return pulse switch 14 which forms a return pulse and transmits this along the fence and which, at the same time, restores Block A 13 to its initial condition so that it again commences to store incoming pulses to thereby commence the formation of the next trigger signal.

Figure 2:
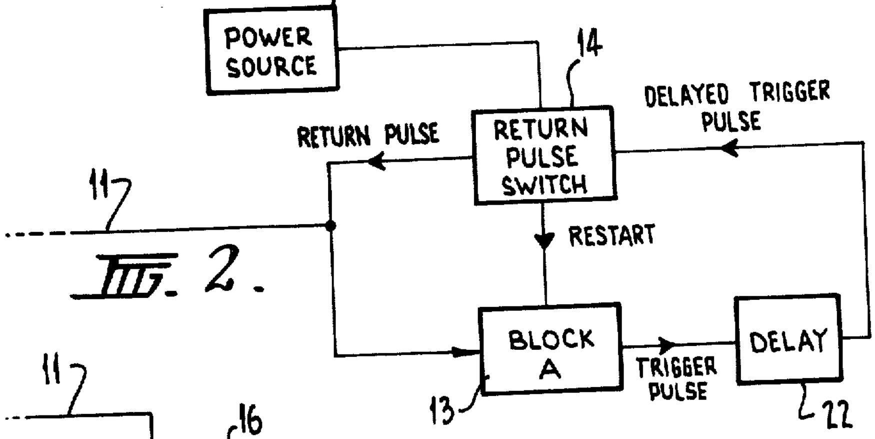
FIG. 2 is a block diagram of an individual responder.
Figure 3:
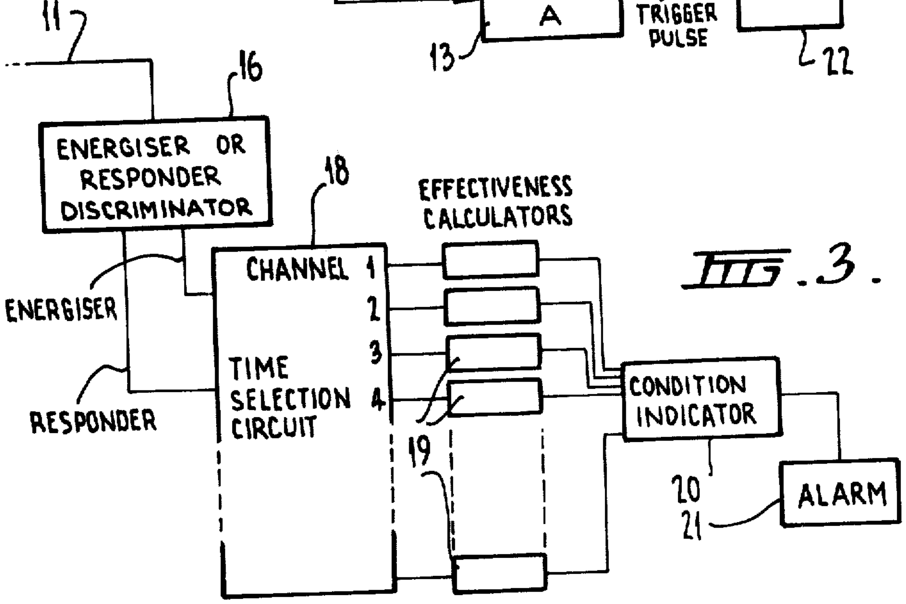
FIG. 3 is a block diagram of a receiver.

FIG. 2 shows the return pulse switch 14 as having an associated power source 15 for the responder but, alternatively, power could be provided by the receiver pulses or by a constant low voltage on the fence.

The delay time of each responder is different so that at any time there can be only one return pulse in the system and by utilising this delay time, the receiver 12 can discriminate between the return pulses from the various responders 10 and thus the various portions of the fence.

The receiver 12 includes an energizer or responder discriminator 16 which detects and discriminates between the pulses of the fence energizer 17 and the pulses from the responders 10. The outputs from the discriminator 16 are passed to a time selection circuit 18 and by noting the delay between the energizer pulses and the responder return pulses, it can separate the return pulses from multiple responder into separate channels and can provide a reading of the effectiveness of the fence associated with this channel. It will be recalled that in this form a responder 10 only initiates a return pulse after a parameter has reached a certain valve and thus, where the fence is less effective than under normal conditions there need to be more fence energizer pulses before initiation of the trigger pulse by Block A and thus there is a longer delay between return pulses and it is by noting this interval that an indication of fence effectiveness can be calculated. Each output from the time selection circuit 18 is passed to an effectiveness calculator 19 and the outputs of these are passed to a condition indicator.

The condition indicator 20 can indicate the effectiveness of any particular channel directly, as on a meter by, say, causing the meter pointer to commence moving from a set point on the scale when each return pulse is received from a particular responder, and to continue moving across the scale until the next return pulse. The extreme travel of the pointer during the interval between successive return pulses can be marked in terms of fence effectiveness. Also associated with the condition indicator is an audible and/or visible alarm 21 which is initiated if the effectiveness of the fence measured over a period is less than a predetermined minimum. It is desired that the period selected is sufficiently long so that the alarm is not set off by relatively short duration changes. For example, if an animal touching the fence causes massive leakage current, or if a farmer deliberately short circuits the fence briefly so that he can safely pass through the fence, it would not be desirable for the alarm 21 to sound unless this condition persisted for an excessive period.

The receiver 12 will of course show if there is a sustained direct short circuit on the fence as under this circumstance no return pulses can be received from any responders situated beyond the short circuit point as viewed from the energizer. At the same time the effectiveness of the fence close to but on the energizer side of the short circuit point will be severely reduced, and so responders 10 located here will signal reduced fence effectiveness.

Similarly a complete break in the fence wire will block energizer pulses to and return pulses from any responder 10 situated beyond the break, as viewed from the energizer. In either of these circumstances the receiver will initiate the alarm after the predetermined time.

As previously stated the responders 10 may be individually powered as by self-contained batteries or may obtain usual power via the fence wires either from the fence energizer pulses of from another applied source, thus obviating the necessity of an independent power supply. As the receiver is normally located with the fence energizer, it can be powered from the same power supply as the energizer. These supplies are conventionally either mains power or the power from an accumulator.

The form of system described may well be varied depending upon requirements. For example, in the system already described, the return signal from the responder 10 could be in the form of a series of pulses or an oscillatory tone. The pulse or oscillatory frequency could be made different for each responder used on a single fence system, providing a means whereby the return signals from multiple responders could be distinguished. In another possible form the incoming pulses could initiate in the responder 10 a return pulse, the length of which is directly related to the effectiveness of the fence. These return pulses could be sent along the fence at predetermined intervals, such as after each energizer pulse or after a predetermined number of energizer pulses.

Where multiple responders 10 are used on a single interconnected fence system, each responder can incorporate a unique value of time delay. This enables a single receiver to differentiate between the return pulses from different responders, so that the effectiveness of the fence at any particular responder can be displayed, and the effectiveness at each responder can be continuously compared with an individually preset or common alarm level.

Instead of using a pulse of variable length or delay it is also possible to use variable pulse numbers or various pulse frequencies to give an indication of the fence effectiveness. In each case, the receiver has to be adapted for the particular parameter being checked.

In a simplified form of the monitor, the return signal from the responder is in some form such as a slowly decaying unidirectional voltage, sent back to a receiver after each fence pulse, or after a predetermined number of fence pulses. In this form, the magnitude of the return voltage signal at the receiver is used as a measure of the fence effectiveness. However, in this form the magnitude of the return signal reaching the receiver depends on the condition and extent of the rest of the connected fence system, as well as the fence pulse strength at the responder. This form is therefore more suited to a lower cost alarm to give a general warning of reduced fence pulse strength, rather than a quantitative measure at a particular point on the fence. This form obviously precludes the use multiple responders on a single fence system.

We claim:

1. In an electric fence including an energizer transmitting a plurality of electric pulses having a predetermined animal deterring value along said fence, a monitoring system comprising at least one responder connected to said fence at a chosen point along its length for receiving said pulses and measuring a predetermined parameter thereof and being activated to transmit a return signal along said fence to a receiver, located at a location on the fence different than the location of the responder, on each occasion said responder receives at least one said electric pulse having said predetermined parameter of a predetermined value indicative of the effectiveness of the fence in deterring animals, said receiver including means for determining the time delay between the return signals from said responder and for providing an alarm indication if the time delay exceeds a value indicative that the effectiveness of the fence has fallen below a predetermined minimum.

2. In an electric fence including an energizer transmitting electric pulses having a predetermined animal deterring value along said fence, a fence monitoring system comprising a plurality of responders for receiving said pulses and measuring a predetermined parameter thereof connected to the fence at chosen points along its length, each said responder being activated to transmit along said fence a return signal characteristic of each responder to a receiver, located at a location on said fence different than the location of said responder, on each occasion each said responder receives at least one transmitted electric fence pulse having said predetermined parameter of a predetermined value indicative of the effectiveness of said fence in deterring animals, said receiver including means for discriminating between said characteristic return signals and also including means for determining the time delay between the transmission of return signals from each respective responder, and means for providing an alarm indication in the event that the time delay between the return signals from any one responder exceeds a predetermined value indicating that the effectiveness of the fence has fallen below a predetermined minimum.

3. The monitor as claimed in claim 1, wherein said responder is activated to transmit a return pulse when the accumulation of said electric pulses from said energiser reaches said predetermined value.

4. The monitor of claim 3, wherein said responder comprises an electronic circuit which is activated by said energiser pulses and provides a trigger pulse to a delay circuit which, in turn, activates a switch which provides said return signal to said receiver when there is no energiser pulse on the fence.

5. The monitor of claim 2, wheein said responder is activated to transmit a return pulse when the accumulation of said electric pulses from said energiser reaches said predetermined value.

6. The monitor as claimed in claim 5, wherein each responder comprises an electronic circuit which is activated by said energiser pulses and provides a trigger pulse to a delay circuit which, in turn, activates a switch which provides said return signal to said receiver when there is no energiser pulse on the fence.

7. The monitor of claim 6, wherein said delay circuit for each responder is so adjusted that the return signals are transmitted at different times relative to the energiser pulses so as to be differentiable at the receiver.

8. The monitor of claim 6, wherein the return signal from each responder is an oscillating signal having a frequency characteristic of said responder so that the return signals from the responders are differentiable at the receiver.

9. The monitor of claim 1 or 2, wherein said parameter is selected from the group comprising the peak voltage, the period, the shape and any combination of these parameters.

* * * * *